(12) United States Patent
Mauder et al.

(10) Patent No.: US 9,954,065 B2
(45) Date of Patent: Apr. 24, 2018

(54) METHOD OF FORMING A SEMICONDUCTOR DEVICE AND SEMICONDUCTOR DEVICE

(71) Applicant: Infineon Technologies AG, Neubiberg (DE)

(72) Inventors: Anton Mauder, Kolbermoor (DE); Frank Pfirsch, Munich (DE); Hans-Joachim Schulze, Taufkirchen (DE); Ingo Muri, Villach (AT); Iris Moder, Villach (AT); Johannes Baumgartl, Riegersdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/936,279

(22) Filed: Nov. 9, 2015

(65) Prior Publication Data

US 2017/0133465 A1    May 11, 2017

(51) Int. Cl.
*H01L 29/10* (2006.01)
*H01L 21/265* (2006.01)
(Continued)

(52) U.S. Cl.
CPC ........ *H01L 29/1095* (2013.01); *H01L 21/265* (2013.01); *H01L 21/304* (2013.01); *H01L 21/30604* (2013.01); *H01L 21/324* (2013.01); *H01L 21/3205* (2013.01); *H01L 27/088* (2013.01); *H01L 29/0661* (2013.01); *H01L 29/0834* (2013.01); *H01L 29/417* (2013.01); *H01L 29/45* (2013.01);
(Continued)

(58) Field of Classification Search
CPC ........ H01L 21/823418; H01L 29/0657; H01L 29/407; H01L 29/456; H01L 29/861; H01L 2924/00; H01L 2924/0002; H01L 29/1095; H01L 21/265; H01L 21/304; H01L 21/30604; H01L 21/3205; H01L 21/324; H01L 27/088; H01L 29/66477; H01L 29/78
See application file for complete search history.

(56) References Cited

U.S. PATENT DOCUMENTS 9,281,359 B2    3/2016  Zundel et al.
2006/0255341 A1*  11/2006  Pinnington ............ B82Y 20/00
                                                                257/79
(Continued)

OTHER PUBLICATIONS

Ogura, A., "SIMOX/SOI processes: flexibility based on thermodynamic considerations", Chapter 4, SIMOX, Edited by M. J. Anc, The Institution of Electrical Engineers, London, United Kingdom, 2004, pp. 63-67.

*Primary Examiner* — Fernando L Toledo
*Assistant Examiner* — Lawrence-Linh T Nguyen
(74) *Attorney, Agent, or Firm* — Murphy, Bilak & Homiller, PLLC (57) ABSTRACT

In accordance with a method of forming a semiconductor device, an auxiliary structure is formed at a first surface of a silicon semiconductor body. A semiconductor layer is formed on the semiconductor body at the first surface. Semiconductor device elements are formed at the first surface. The semiconductor body is then removed from a second surface opposite to the first surface at least up to an edge of the auxiliary structure oriented to the second surface.

20 Claims, 8 Drawing Sheets (51) Int. Cl.
  *H01L 21/324* (2006.01)
  *H01L 21/304* (2006.01)
  *H01L 21/306* (2006.01)
  *H01L 21/3205* (2006.01)
  *H01L 27/088* (2006.01)
  *H01L 29/66* (2006.01)
  *H01L 29/78* (2006.01)
  *H01L 29/417* (2006.01)
  *H01L 29/45* (2006.01)
  *H01L 29/739* (2006.01)
  *H01L 29/06* (2006.01)
  *H01L 29/08* (2006.01)

(52) U.S. Cl.
  CPC .. *H01L 29/66348* (2013.01); *H01L 29/66477* (2013.01); *H01L 29/7397* (2013.01); *H01L 29/78* (2013.01)

(56) References Cited

U.S. PATENT DOCUMENTS

| | | | |
|---|---|---|---|
| 2010/0090701 A1* | 4/2010 | Ziolkowski | G01V 3/12 324/334 |
| 2014/0090701 A1* | 4/2014 | Rim | H01L 31/035272 136/256 |
| 2014/0225126 A1* | 8/2014 | Aketa | H01L 29/41766 257/77 |

* cited by examiner

METHOD OF FORMING A SEMICONDUCTOR DEVICE AND SEMICONDUCTOR DEVICE

BACKGROUND

Semiconductor devices, for example diodes, insulated gate field effect transistors (IGFETs) such as metal oxide semiconductor field effect transistors (MOSFETs), insulated gate bipolar transistors (IGBTs) include a semiconductor body with doped zones that define the functionality of the semiconductor device. For some semiconductor devices characteristic device parameters, for example blocking voltage capability or on-state resistance are a function of a thickness of the semiconductor body between a front and a back surface. Thickness variations of the semiconductor body spread the distribution of such device parameters. It is desirable to reduce the thickness variations of semiconductor bodies of semiconductor devices.

SUMMARY

The present disclosure relates to a method of forming a semiconductor device. The method comprises forming an auxiliary structure at a first surface of a silicon semiconductor body. The method further comprises forming a silicon layer on the semiconductor body at the first surface. The method further comprises forming semiconductor device elements at the first surface. The method further comprises removing the semiconductor substrate from a second surface opposite to the first surface at least up to an edge of the auxiliary structure oriented to the second surface.

The present disclosure also relates to a semiconductor device. The semiconductor device comprises a semiconductor body comprising opposite first and second surfaces. A first load terminal contact is at the first surface. An array of recesses is in the semiconductor body at the second surface. The recesses have a center-to-center distance p smaller than 2 μm. A second load terminal contact is at the second surface and covers the array of recesses.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. "Wafer" and "structure" are to be understood to include silicon (Si), silicon-on-insulator (SOI), silicon-on sapphire (SOS), doped and undoped semiconductors, epitaxial layers of silicon supported by a base semiconductor foundation, and other semiconductor structures. As a typical base material for manufacturing a variety of such semiconductor devices, silicon wafers grown by the Czochralski (CZ) method, e.g. by the standard CZ method or by the magnetic CZ (MCZ) method or by the Continuous CZ (CCZ) method may be used. Also, FZ (Float-Zone) silicon wafers may be used. The semiconductor need not be silicon-based. The semiconductor could as well be silicon germanium (SiGe), germanium (Ge) or gallium arsenide (GaAs).

According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, Al, Ti and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g. along four orthogonal directions in the plane of the tape. By dicing and pulling the tape, the semiconductor wafer is divided into a plurality of semiconductor dies (chips).

Figure 1:
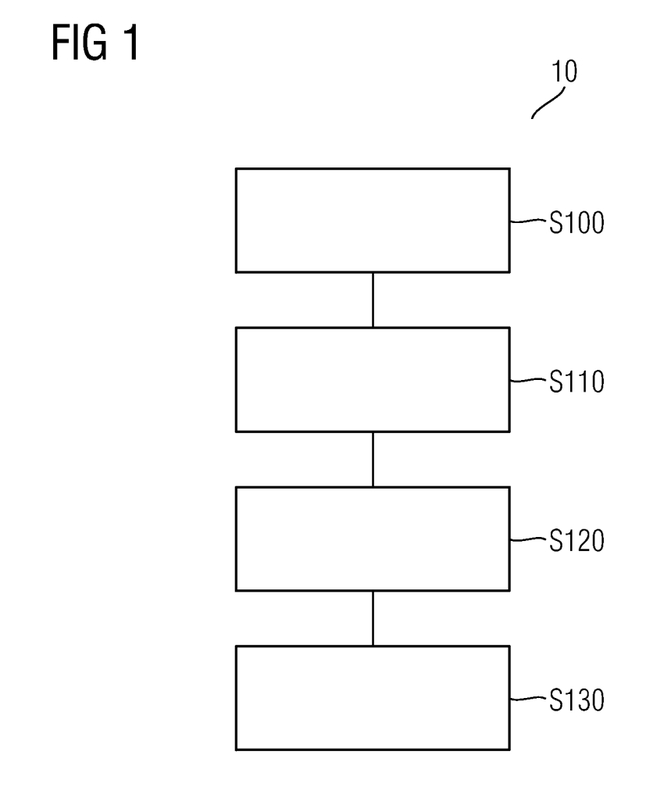
FIG. 1 is a schematic flow diagram for illustrating a method of manufacturing a semiconductor device.

FIG. 1 is a schematic flow diagram for illustrating a method 10 of manufacturing a semiconductor device.

It will be appreciated that while method 10 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

A schematic flow diagram for illustrating a method 10 of manufacturing a semiconductor device is depicted in FIG. 1.

Process feature S100 comprises forming an auxiliary structure at a first surface of a semiconductor body. In some embodiments, a material of the semiconductor body may be selectively patterned with respect to the auxiliary structure and the auxiliary structure may be configured to withstand temperatures of at least 1000° C. The auxiliary structure may include one or more layers of silicon oxide, for example $SiO_2$, silicon nitride, for example $Si_3N_4$, oxynitride, for example ONO, aluminum oxide, for example $Al_2O_3$, carbon, stacks or mixtures of these materials configured to match the thermal expansion of the material of the semiconductor body. In some embodiments, the auxiliary structure is an oxide structure formed by a thermal oxidation process. In addition or as an alternative, the oxide structure may also be formed by an oxide layer deposition process, for example by a chemical vapor deposition (CVD) process. In some other embodiments, the oxide structure is buried below the first surface by an ion implantation process. The oxide structure optionally may be patterned e.g. by an etching or structuring process of a previously formed oxide layer or by a local growth of the oxide structure or by locally shading areas of the implantation process, for example.

Process feature S110 comprises forming a semiconductor layer on the semiconductor body at the first surface. In some embodiments, the semiconductor layer is formed by an epitaxial process such as selective epitaxy, for example epitaxial lateral overgrowth (ELO). The epitaxial layer may be formed as a single layer or may include two, three or more sub-layers stacked on each other. The single layer or sub-layers may be doped in-situ and/or be doped by introducing dopants by diffusion from a diffusion source or by ion implantation, for example. In some embodiments, the semiconductor layer includes a first sub-layer and a second sub-layer on the first sub-layer. A doping concentration of the first sub-layer may be greater than a doping concentration of the second sub-layer. In some embodiments, a doping concentration of the first sub-layer may be in a range of $5 \times 10^{14}$ cm$^{-3}$ to $5 \times 10^{19}$ cm$^{-3}$ and a doping concentration of the second sub-layer may be in a range of $1 \times 10^{13}$ cm$^{-3}$ and $5 \times 10^{19}$ cm$^{-3}$. Parameters of the first and second sub-layers such as doping concentration and thickness may be set in consideration of different device characteristics. By way of example, doping concentration and thickness of the first sub-layer may be set in consideration of contact properties or rear side processing or blocking voltage, and doping concentration and thickness of the second sub-layer may be set in consideration of blocking voltage requirements and/or on-state resistance, for example. In some embodiments, for example diodes and/or IGBTs, the first sub-layer constitutes a field stop layer including an optional contact or emitter layer formed therein.

Process feature S120 comprises forming semiconductor device elements at the first surface. The device elements may include semiconducting regions, for example p- and/or n-doped regions doped regions, insulating layers, for example gate and/or field dielectric(s) and/or interlayer dielectric(s) and conducting layers such as metal layer(s) for contacts and/or wirings. The semiconductor regions, for example a doped drain region, a doped source region, a doped body region, a doped anode region, a doped cathode region may be formed at the first surface by ion implantation and/or diffusion from a diffusion source, for example. A planar gate structure including a gate dielectric and a gate electrode or a gate structure including a gate dielectric and a gate electrode in a trench may be formed by thermal oxidation and/or layer deposition of the gate dielectric and layer deposition of a highly doped semiconductor, for example polycrystalline silicon and/or metal layer(s).

Process feature S130 comprises removing the semiconductor body from a second surface opposite to the first surface at least up to an edge of the auxiliary structure oriented to the second surface. Material removal may include mechanical and/or chemical processes including abrasive machining, for example one or more of grinding, honing, and polishing, chemical mechanical polishing (CMP), and etching, for example wet etching of silicon such as alkaline etching based on alkaline etch solutions providing OH⁻ ions, and dry etching such as reactive ion etching. Examples of alkaline etch solutions include KOH (potassium hydroxide), TMAH (tetramethyl ammonium hydroxide), choline (hydroxytrimethylethanamoniumchloride), and EDP (ethylenediamene pyrocatecol). The etch solutions may also contain amounts of surface active agents, which are typically used in wet chemical etching, for example pyrazine, triton-x-100 and isopropyl alcohol.

In some embodiments, the process of forming an oxide structure as the auxiliary structure comprises implanting oxygen ions into the semiconductor body through the first surface at an ion implantation energy smaller than 100 keV. The ion implantation energy may also be set smaller than 60 keV. Thereby oxygen aggregations may be buried in the semiconductor body at a distance of approximately 250 nm or at a distance of approximately 150 nm or at an even lower distance. A longitudinal variation of the implanted oxygen may also be reduced, for example to values smaller than 70 nm or smaller than 50 nm. Thus, a small dose of oxygen in a range of $10^{14}$ cm$^{-2}$ and $10^{17}$ cm$^{-2}$ or in a range of $10^{14}$ cm$^{-2}$ and $5 \times 10^{15}$ cm$^{-2}$ may be sufficient for formation of local silicon oxide regions in a silicon semiconductor body, for example. In some embodiments, a high-current ion implantation equipment is used for oxygen implantation. In some embodiments, an ion implantation equipment is used for oxygen implantation which allows for heating of the implanted wafer during implantation to a temperature between e.g. 300° C. and 600° C. or between 400° C. and 500° C. Implanting oxygen into heated substrates reduces an amount of lattice defects caused by oxygen implantation and, thus, allows to use implantation energies significantly smaller than 180 keV.

By thermal processing of the semiconductor body, the as-implanted oxygen is reallocated to oxygen precipitates. Thermal processing may include one or more heating periods that may comprise temperature ramps and/or temperature levels. In some embodiments, in a first heating period of 1 hour to 5 hours, the semiconductor body is heated up to a first temperature configured to generate nucleation sites for subsequent oxygen precipitate formation. The first temperature may be in a range of e.g. 800° C. and 900° C. In a second heating period of 1 hour to 10 hours, the semiconductor body is heated up to a second temperature configured to generate oxygen precipitates. The second temperature may be in a range of e.g. 900° C. and 1100° C. In some embodiments, prior to oxygen ion implantation, the semiconductor body is irradiated with particles from the first surface. Particle irradiation aims at introducing additional vacancies into the crystal lattice for promoting subsequent oxygen precipitate formation. Electron and/or helium irradiation at doses in a range of $10^{13}$ cm$^{-2}$ and $10^{15}$ cm$^{-2}$ are examples of particles configured to generate vacancies for promoting subsequent oxygen precipitate formation. Vacancy generation by particle irradiation prior to oxygen precipitate formation allows for a reduction of subsequent ion implantation dose of oxygen and/or substrate temperature during ion implantation of oxygen.

In some embodiments, oxygen is implanted through an overall area of the first surface. In some other embodiments, prior to oxygen ion implantation, the method 10 further comprises forming a patterned ion implantation mask is on the first surface. The ion implantation mask may be a patterned hard mask or a patterned resist mask, for example. The pattern of the ion implantation mask may be chosen in consideration of functions of the oxide structure. Apart from acting as a stop layer when removing material of the semiconductor body from the second surface, the oxide structure may serve for additional purposes. As an example, the oxide structure, after removal of the semiconductor body from the second surface, may act as a mask pattern for ion implantation of dopant ions through the second surface, for example during formation of n-doped short regions and/or p⁺-doped injection regions at a collector side of a reverse conducting (RC) IGBT. As an example, the oxide structures, after removal of the semiconductor body from the second surface, may also serve for attenuating a dose of doping, thereby reducing injection efficiency in those areas that are masked, for example, areas surrounding a transistor cell area such as edge termination areas.

In some embodiments, the method 10 further comprises, prior to patterned ion implantation mask formation, forming alignment marks, and wherein the patterned ion implantation mask is aligned with the alignment marks. The alignment masks may be formed at the first surface or constitute etch recesses in the semiconductor body at the first surface, the etch recesses being configured to be identified after semiconductor layer formation on the first surface of the semiconductor body, for example by epitaxial growth or deposition. If a thickness of the semiconductor layer becomes too large, it may become difficult to identify the alignment marks. In this case, the alignment marks can be renewed by repeating alignment mask formation at the first surface of the semiconductor body.

In some embodiments, the process of forming an auxiliary structure comprises forming an auxiliary layer pattern on the first surface of the semiconductor layer. The auxiliary layer pattern may be formed by lithography, for example.

In some embodiments, the auxiliary layer pattern comprises an array of openings, and a center-to-center distance p of the array of openings is smaller than 2 μm or smaller than 1 μm. The center-to-center distance p may be set small enough to allow for formation of a continuous epitaxial layer, for example by epitaxial lateral overgrowth (ELO). The center-to-center distance p may be also be set small enough to avoid dishing that may otherwise be caused by an abrasive machining for removing material of the semiconductor body from the second surface up to the auxiliary layer pattern.

In some embodiments, a thickness of the auxiliary layer pattern is set in a range of 5 nm and 2 μm, or in a range of 20 nm and 200 nm, or in a range of 50 nm and 150 nm. The thickness may be chosen in consideration of function(s) ascribed to the auxiliary layer pattern. As an example, the thickness may be large enough for allowing the auxiliary layer pattern to act as a stop layer when removing material of the semiconductor body from the second surface. The thickness may also be set appropriately to allow the auxiliary layer pattern to act as a mask in subsequent doping or ion implantation processes at the second surface of the semiconductor body. The thickness may also be set appropriately to meet crystal quality requirements when forming a continuous epitaxial layer by epitaxial lateral overgrowth on the auxiliary layer pattern. It should be noted that, in some embodiments, the auxiliary layer may not be configured to act as a dielectric layer in an electronic device. This means, for example, that a porous or perforated auxiliary layer can be tolerated. Or in other words, the demands on methods for generating the auxiliary layer may be relaxed, e.g. small defects during structuring the auxiliary layer leading to small, unintended additional holes or not ideal stoichiometric auxiliary material, for example not ideal stoichiometric oxide after ion implantation may not lead to negative effects during thinning. Small in this context means smaller than the intended openings in the auxiliary layer.

In some embodiments, a thickness of the semiconductor layer is set at least ten times greater than the center-to-center distance p. In some embodiments, a ratio of a surface area of the semiconductor body covered by auxiliary layer material of the auxiliary layer pattern and a surface area below openings in the auxiliary layer pattern is in a range of 0.2 to 2, or in a range of 0.8 to 1.2, and a maximum lateral dimension of any one of the openings is smaller than 2 μm. The range of 0.2 to 2, or the range of 0.8 to 1.2 is beneficial with regard to minimization of crystal defect generation during the epitaxial lateral overgrowth process.

In some embodiments, the method 10 further comprises, after forming semiconductor device elements at the first surface, and prior to removing the semiconductor body from a second surface, mounting the semiconductor body to a carrier via the first surface. Characteristics of the carrier, for example material and thickness may be adapted to the function of a mechanical support carrier during removal of semiconductor material of the semiconductor body from the second surface. As an example, the carrier may be a glass carrier, a semiconductor carrier, a foil or a protection resist, for example.

In some embodiments, abrasive machining is used to remove the semiconductor body from the second surface, wherein the abrasive machining is stopped at a vertical distance to the edge of the auxiliary structure oriented to the second surface. The semiconductor body is then further removed up to the edge of the auxiliary structure oriented to the second surface by an etch process. As an example, abrasive machining, for example grinding is terminated some micrometers before reaching the auxiliary structure. In some embodiments, abrasive machining removes semiconductor material from an overall area of the second surface. In some other embodiments, abrasive machining acts on a center portion of the semiconductor body leaving an edge portion surrounding the center portion unaffected for improving mechanical stability of the semiconductor body. The etch process may be a dry etch process, for example an reactive ion etch process and/or a wet etch process, for example an alkaline etch process based on alkaline etch solutions providing OH⁻ ions. In some embodiments the etch process may be replaced by or supported by a polishing process.

In some embodiments, the method 10 further comprises forming recesses in the semiconductor body caused by the etch process affecting the semiconductor body through openings in the auxiliary layer pattern. By alkaline etching of silicon, different etch rates with respect to {100} and {111} crystal planes may lead to an array of recesses, wherein the recesses are congruent with openings of the auxiliary layer pattern. This may be also achieved by using tilted reactive ion etching (RIE). Dependent on the auxiliary thickness and the distance of the auxiliary structures, the etch process may stop self-adjusted due to a shadowing effect of the etch process caused by the auxiliary layer pattern. The recesses allow for adjustment of a surface roughness at the second surface that may be beneficial with respect to electric contact and/or adhesion properties between the semiconductor body and a contact layer, for example a metal layer at the second surface. The surface roughness may be decreased by a subsequent polishing and/or lapping process.

By combining semiconductor layer formation on an auxiliary structure at the first surface of the semiconductor body and semiconductor body thinning from the second surface opposite to the first surface using the auxiliary structure as a termination structure for the removal process, a precise method of semiconductor body thinning is achieved. The method allows for a small total thickness variation (TTV) having a precise and well-defined surface roughness in the micro- or nanometer range.

In some embodiments, the method 10 further comprises implanting dopant ions into the semiconductor body through the second surface, the auxiliary structure constituting an ion implantation mask. Apart from acting as a termination structure when removing the semiconductor body from the second surface, the auxiliary structure may serve for the different purpose of blocking or attenuating ion implantation through the second surface into the semiconductor body. As an example, omitting a rear side charge injection layer in areas of an edge termination or gate pad of power diodes or IGBTs by blocking of ion implantation during rear side charge injection layer formation allows for an increased switching robustness, for example. The increased switching robustness results from a reduction of charge carrier flooding in these areas during forward-bias mode of the semiconductor device.

In some embodiments, the method 10 further comprises forming a contact layer on the semiconductor body at the second surface. The contact layer includes one or more conductive materials such as highly doped semiconductor materials and/or metals, for example.

In some embodiments, the method 10 further comprises removing the auxiliary structure from the second surface.

FIGS. 2A to 2G are cross-sectional views of a semiconductor body 100 for illustrating process features of a method of manufacturing a semiconductor device. Further details of the process features illustrated below with reference to FIGS. 2A to 2G are given above for similar process features and likewise apply.

Figure 2A:
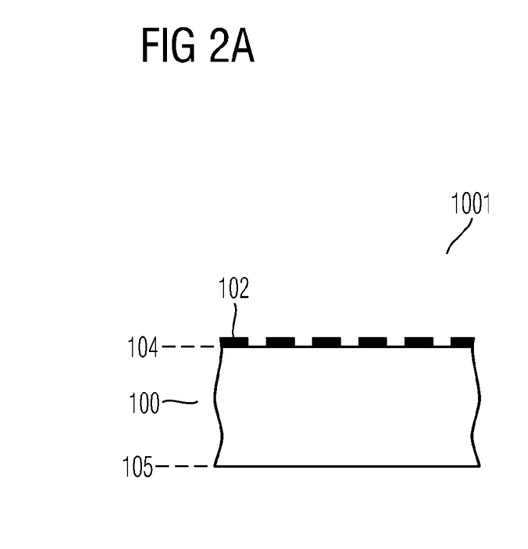
FIGS. 2A to 2G are cross-sectional views of a semiconductor body for illustrating processes of a method of manufacturing a semiconductor device.

Referring to the schematic cross-sectional view 1001 of FIG. 2A, an auxiliary structure is formed at a first surface 104 of the semiconductor body 100 as an auxiliary layer pattern 102. The first surface 104 is opposite to a second surface 105 of the semiconductor body 100.

Figure 2B:
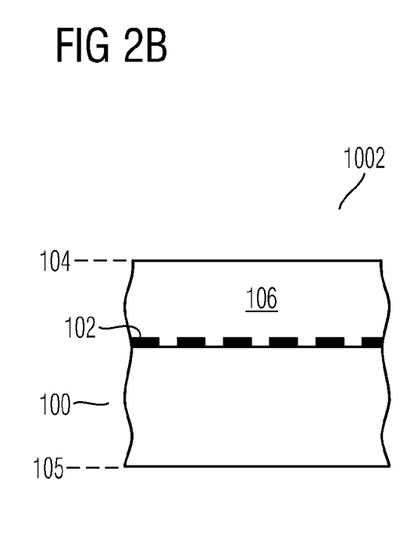

Referring to the schematic cross-sectional view 1002 of FIG. 2B, a semiconductor layer 106 is formed on the semiconductor body 100 at the first surface 104 by epitaxial lateral overgrowth.

Figure 2C:
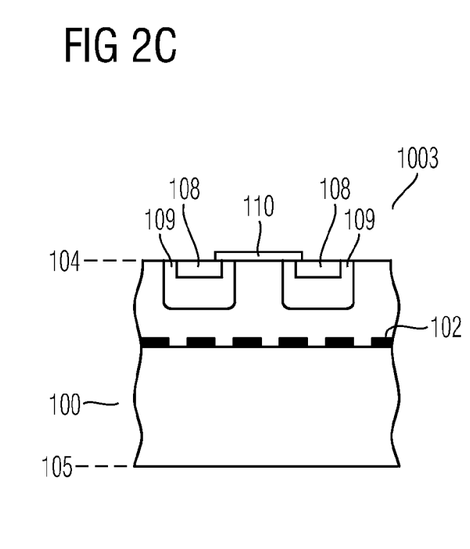

Referring to the schematic cross-sectional view 1003 of FIG. 2C, semiconductor device elements are formed at the first surface 104. Formation of the semiconductor device elements may include front-end-of-line (FEOL) processes and is exemplified in FIG. 2C as doped regions 108, 109, for example source and body regions and a dielectric 110 that may be part of a lateral IGFET including a planar gate structure. Other and/or additional processes as described above with respect to the method 10 may be applied.

Figure 2D:
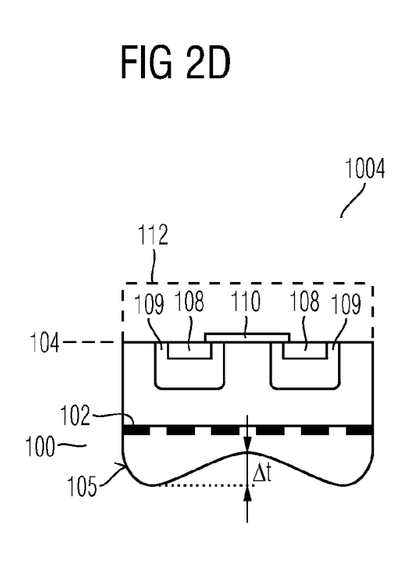

Referring to the schematic cross-sectional view 1004 of FIG. 2D, the semiconductor body 100 is removed from the second surface 105 by abrasive machining, for example grinding. Abrasive machining is terminated at a vertical distance, for example some micrometers before the auxiliary layer pattern 102, and results in a thickness variation Δt caused by in-wafer or wafer-to-wafer process scattering. The semiconductor body 100 may be mounted on a carrier indicated by a dashed line 112 via the first surface 104.

Figure 2E:
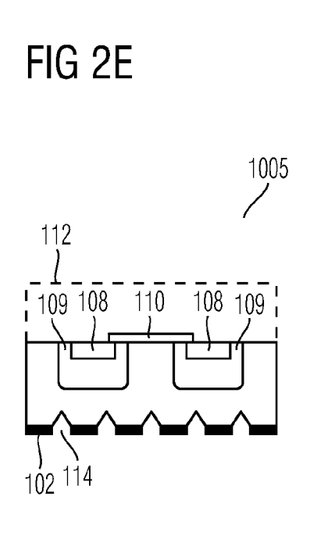

Referring to the schematic cross-sectional view 1005 of FIG. 2E, alkaline wet etching further removes material of the semiconductor body 100 up to the auxiliary layer pattern 102 acting as an etch termination structure. The alkaline etch solution further removes material of the semiconductor layer 106, for example a silicon layer in areas of the semiconductor layer 106 that are not covered by the auxiliary layer pattern 102 resulting in tapered recesses 114. The shape of the tapered recesses 114 may be caused by different etch rates with respect to {100} and {111} crystal planes.

Figure 2F:
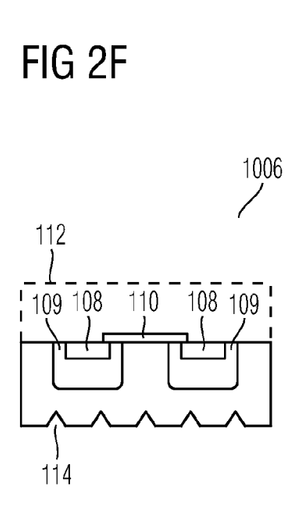

Referring to the schematic cross-sectional view 1006 of FIG. 2F, the auxiliary layer pattern 102 is removed, for example by an etch process such as a Hydrofluoric Acid (HF) or a dry chemical etch process.

Figure 2G:
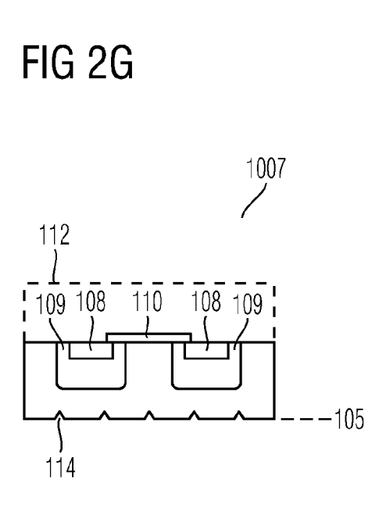

Referring to the schematic cross-sectional view 1007 of FIG. 2G, a depth of the tapered recesses 114 is reduced by removing further material from the second surface 105, for example by lapping or by an isotropic etch process such as reactive ion etching or by an anisotropic etch process in alkaline solutions (e.g. KOH, TMAH), for example.

It is to be noted that the process feature described with respect to FIG. 2G and/or FIG. 2F may be omitted if the auxiliary structure and recesses constitute functional elements of the semiconductor device to be formed. For example, if the auxiliary layer pattern 102 shall remain as a functional layer in the semiconductor device to be manufactured or if the recesses illustrated in FIG. 2F shall remain in the semiconductor device to be manufactured. Further processes, for example dopant introduction through the second surface 105 by ion implantation and/or diffusion and/or contact layer formation may be carried out subsequent to the process features illustrated in any of FIGS. 2E to 2G, for example.

By combining the process features illustrated in FIGS. 2A to 2G, a precise method of thinning a semiconductor body is achieved. The method allows for a small total thickness variation (TTV) having a precise and well-defined surface roughness in the micro- or nanometer range at the second surface 105.

FIGS. 3A to 3D are schematic top views of layouts of the auxiliary layer pattern 102 on the semiconductor body prior to semiconductor layer formation.

Figure 3A:
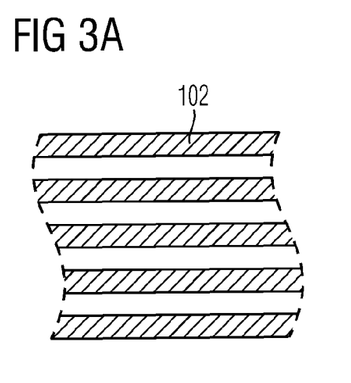
FIGS. 3A to 3D are schematic top views of layouts of a semiconductor structure on the semiconductor body prior to semiconductor layer formation.
Figure 3B:
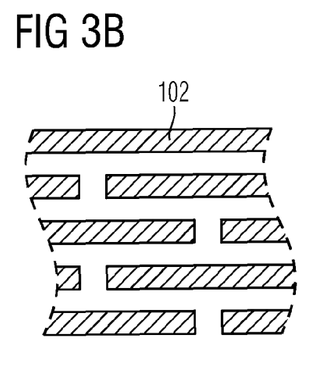
Figure 3C:
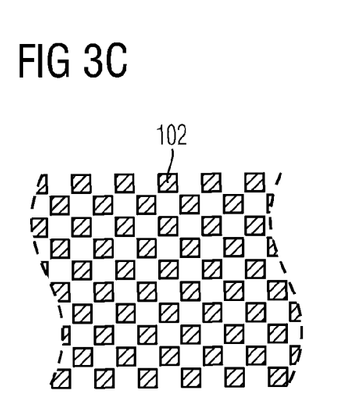
Figure 3D:
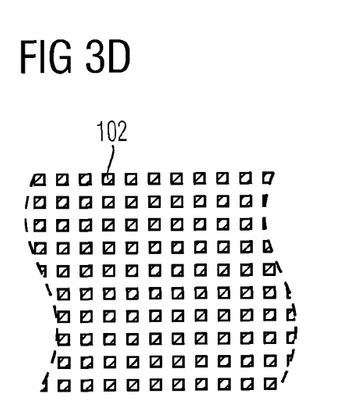

A layout of the auxiliary layer pattern 102 may comprise a plurality of parallel stripes (cf. FIG. 3A), a plurality of parallel stripes that are each interrupted along an extension direction (cf. FIG. 3B), a checkerboard pattern (cf. FIG. 3C), or a grid (cf. FIG. 3D). When horizontal or vertical edges of the auxiliary layer pattern 102 correspond to [100] or [010] edges of the semiconductor body and/or corners of the auxiliary layer pattern 102 are right-angled or almost right-angled, quality of epitaxial overgrowth can be improved, and crystal defects may be reduced or avoided in the layer(s) grown by ELO.

Further details on layout parameters of the auxiliary layer such as vertical and lateral dimensions, center-to-center distances, or surface area coverage with the auxiliary layer pattern and openings are provided above with respect to the method 10 illustrated in FIG. 1 and likewise apply.

In some embodiments, the method and process features described with reference to FIGS. 1 to 2G result in a semiconductor device comprising a semiconductor body comprising opposite first and second surfaces. The semiconductor device further comprises a first load terminal contact at the first surface. An array of recesses is formed in the semiconductor body at the second surface. A center-to-center distance p of the recesses is smaller than 2 μm, or smaller than 1 μm. The semiconductor device further comprises a second load terminal contact at the second surface, the second load terminal contact covering the array of recesses. Examples of the semiconductor device will be described below with reference to FIGS. 4A to 4D.

Figure 4A:
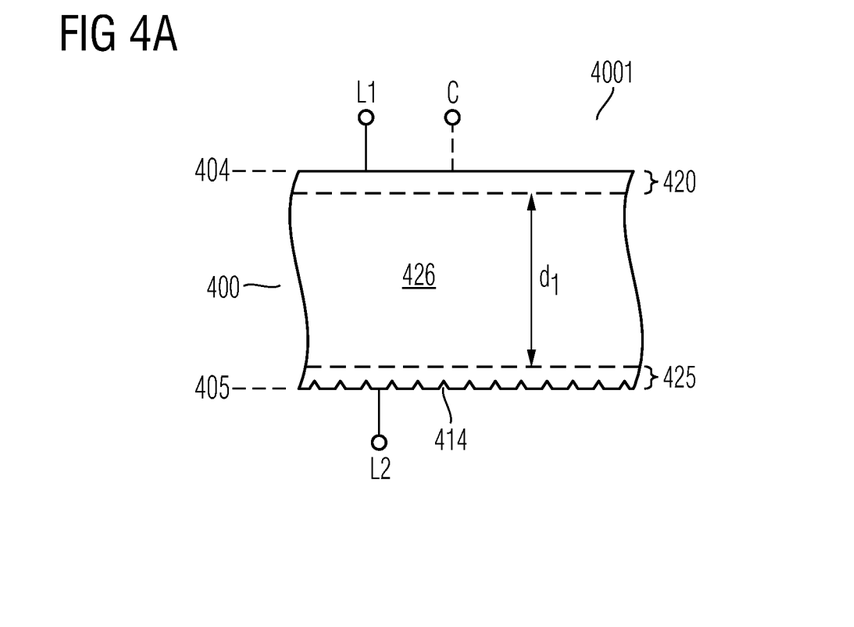
FIGS. 4A to 4C are cross-sectional views of a semiconductor body for illustrating semiconductor devices that may be formed by including the processes illustrated in FIGS. 2A to 2F.

FIG. 4A is a schematic cross-sectional view 4001 of a portion of a vertical semiconductor device according to an embodiment. The vertical semiconductor device comprises a semiconductor body 400. The vertical semiconductor device includes a first load terminal structure 420 at a first surface 404, e.g. front surface of the semiconductor body 400. The first load terminal structure 420 includes doped semiconductor region(s). The doped semiconductor region(s) may be formed by doping processes of the semiconductor body 400 at the first surface 404, e.g. by diffusion and/or ion implantation processes. The doped semiconductor region(s) in the semiconductor body 400 of the first load terminal structure 420 may include doped source and body regions of a vertical power IGFET, for example a superjunction FET or of a collector of an IGBT, or of an anode or cathode region of a vertical power semiconductor diode or thyristor, for example. In the course of processing the semiconductor body 400 at the first surface 404, depending on the power semiconductor device to be formed in the semiconductor body, a control terminal structure such as a planar gate structure and/or a trench gate structure including gate dielectric(s) and gate electrode(s) may be formed. These processes may be carried out as part of the processes described with reference to FIG. 2C or process feature S120 of FIG. 1.

The vertical semiconductor device further includes a second load terminal structure 425 at a second surface 405, e.g. a rear surface of the semiconductor body 400 opposite to the first surface 404. Tapered recesses 414 are formed at the second surface 405 as described with reference to FIGS.

2E to 2F, for example. The second load terminal structure 425 includes doped semiconductor region(s). The doped semiconductor region(s) may be formed by doping processes of the semiconductor body 400 at the second surface 405, e.g. by diffusion and/or ion implantation processes. The doped semiconductor region(s) in the semiconductor body 400 of the second load terminal structure 425 may include doped field stop region(s), doped drain regions of a vertical power FET, or an emitter of an IGBT, or an anode or cathode region of a vertical power semiconductor diode, for example.

A first electrical load terminal contact L1 to the first load terminal structure 420 and an electrical control terminal contact C to a control terminal structure, if present in the vertical power semiconductor device, are part(s) of a wiring area above the first surface 404. A second electrical load contact L2 to the second load terminal structure 425 is provided at the second surface 405. The second load terminal contact covers the tapered recesses 414, if still present. The electrical load contacts L1, L2 and the electrical control terminal contact C may be formed of one or a plurality of patterned conductive layers such as metallization layers electrically isolated by interlayer dielectric layer(s) sandwiched between. Contact openings in the interlayer dielectric layer(s) may be filled with conductive material(s) to provide electrical contact between the one or the plurality of patterned conductive layers and/or active area(s) in the silicon semiconductor body such as the first load terminal structure 420, for example. The patterned conductive layer(s) and interlayer dielectric layer(s) may form the wiring area above the semiconductor body 400 at the first surface 404, for example. A conductive layer, e.g. a metallization layer or metallization layer stack may be provided at the second surface 405, for example.

In the vertical semiconductor device illustrated in FIG. 4A, a current flow direction is between the first and second load terminal contacts L1, L2 along a vertical direction between the opposite first and second surfaces 404, 405.

In the embodiment illustrated in FIG. 4A, a blocking voltage capability of the vertical semiconductor device can be adjusted by an appropriate distance $d_1$ of a drift or base zone 426 between the first and second load terminal structures 420, 425, for example between a body region and a drain contact region or a field stop zone of a FET.

Figure 4B:
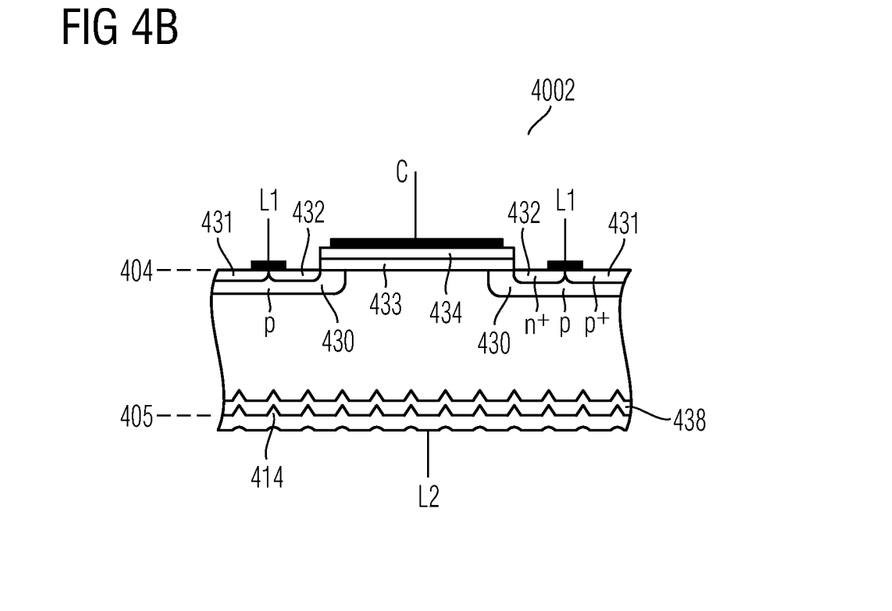

In the schematic cross-sectional view 4002 of FIG. 4B, the semiconductor device manufactured based on the processes illustrated in FIGS. 1 to 2D is a planar gate transistor comprising a p-doped body region 430, a $p^+$-doped body contact region 431 and an $n^+$-doped source region 432. A gate dielectric 433 electrically isolates a gate electrode 434 from the drift or base zone 426. The gate electrode 434 is electrically connected to the control terminal contact C. In some embodiments, the gate electrode 434 corresponds to or is electrically coupled to the control terminal contact C. The first load terminal contact L1, for example an emitter terminal contact of an IGBT or a source terminal contact of an IGFET is electrically connected to the p-doped body region 430 and to the $n^+$-doped source region 432. A highly doped region 438, for example a $p^+$-doped bipolar injection region of an IGBT or an $n^+$-doped drain contact region of an IGFET at the second surface 405 is electrically connected to the second load terminal contact L2, for example a collector terminal contact of an IGBT or a drain terminal contact of an IGFET.

Figure 4C:
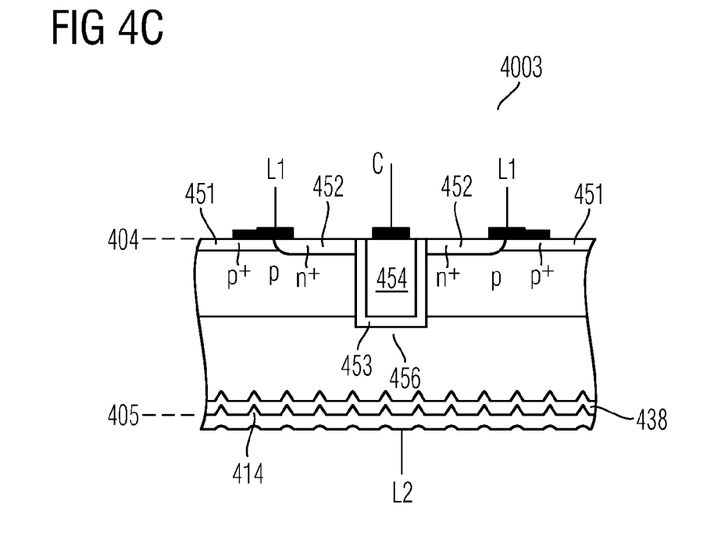

In the schematic cross-sectional view 4003 of FIG. 4C, the semiconductor device manufactured based on the processes illustrated in FIGS. 1 to 2D is a trench gate transistor comprising a p-doped body region 450, a $p^+$-doped body contact region 451 and an $n^+$-doped source region 452. A gate dielectric 453 in a trench 456 electrically isolates a gate electrode 454 from the drift or base zone 405. The gate electrode 454 is electrically connected to the control terminal contact C. In some embodiments, the gate electrode 454 corresponds to the control terminal contact C. The first load terminal contact L1, for example a source terminal contact or an emitter terminal contact is electrically connected to the p-doped body region 450 and to the $n^+$-doped source region 452. The highly doped region 438, for example a $p^+$-doped bipolar injection region of an IGBT or an $n^+$-doped drain contact region of an IGFET at the second surface 405 is electrically connected to the second load terminal contact L2, for example a collector terminal contact or a drain terminal contact. In addition to the gate dielectric 453 and the gate electrode 454, one or more field dielectric(s) and field electrode(s) may be arranged in the trench 456, for example between the gate electrode 454 and a bottom side of the trench.

Figure 5A:
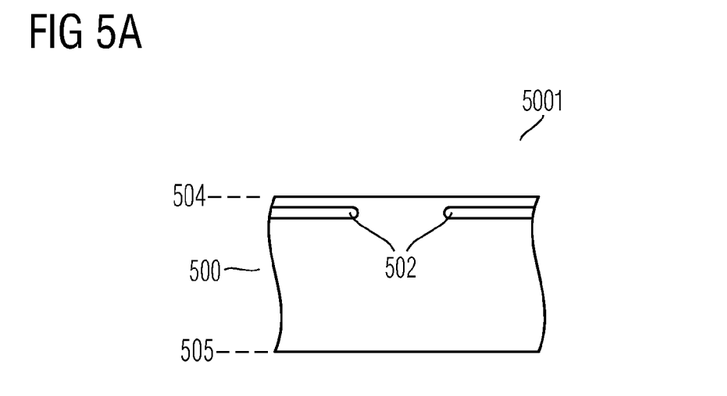
FIGS. 5A to 5F are cross-sectional views of a semiconductor body for illustrating a method of manufacturing a semiconductor device.
Figure 5B:
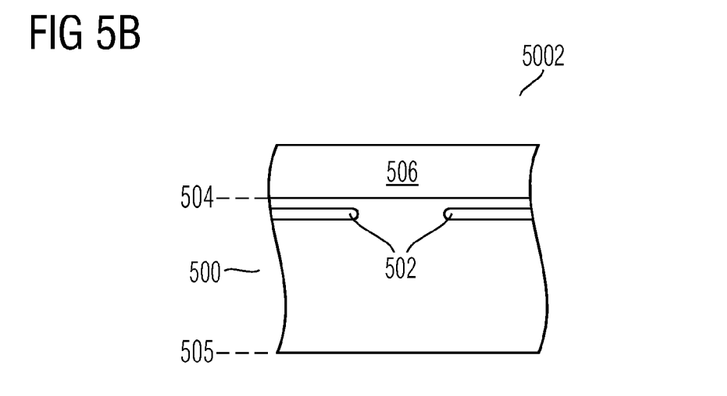
Figure 5C:
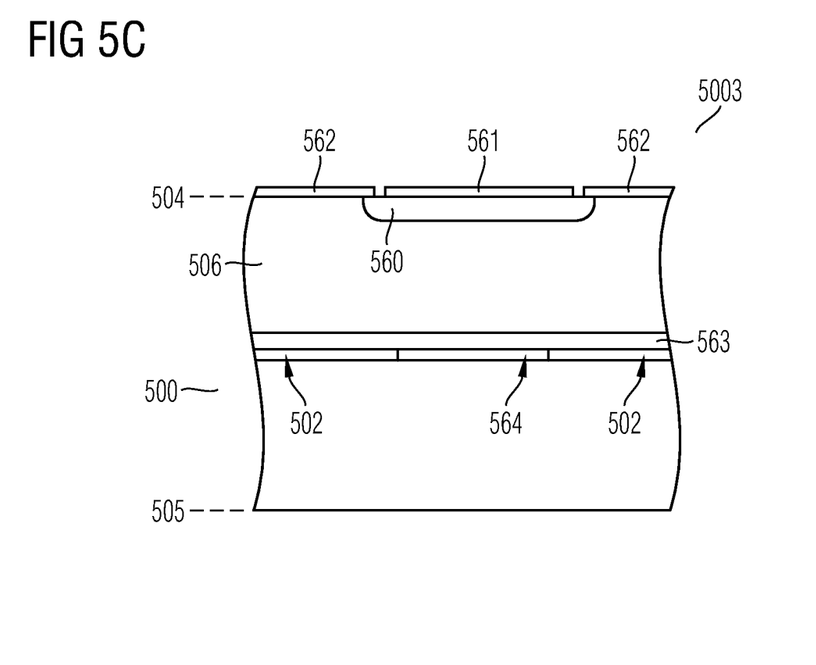

FIGS. 5A to 5C are cross-sectional views of a semiconductor body for illustrating processes of a method of manufacturing a semiconductor device.

The schematic cross-sectional view of FIG. 5A is one example of a cross-sectional view of a semiconductor body 500 after carrying out process feature S100 of the method 10 illustrated in FIG. 1.

Referring to the schematic cross-sectional view 5001 of FIG. 5A, a buried auxiliary structure is formed at a first surface 504 of the semiconductor body 500 as a buried auxiliary layer pattern 502. The first surface 504 is opposite to a second surface 505 of the semiconductor body 500. Further details on formation of the buried auxiliary layer pattern 502 are provided above with respect to the method 10 illustrated in FIG. 1 and likewise apply.

Referring to the schematic cross-sectional view 5002 of FIG. 5B, a semiconductor layer 506 is formed on the semiconductor body 500 at the first surface 104 by an epitaxial layer formation process, for example a CVD process.

Referring to the schematic cross-sectional view 5003 of FIG. 5C, semiconductor device elements are formed in the semiconductor body 500. The semiconductor device elements include an active area structure 560 at the first surface 504, a first load contact 561 on the active area structure 560, an edge termination structure 562 surrounding the active area structure 560, a doped region 563, and a contact or charge injection layer 564. Depending on the semiconductor device to be manufactured, the active area structure 560 may include doped body and source regions of an IGBT or an anode region of a power diode, for example. It should be noted that the active area structure 560 may include structures as described in conjunction with FIG. 4B and/or FIG. 4C. The contact or charge injection layer 564 is congruent with an opening of the buried auxiliary layer pattern 502. The contact or charge injection layer 564 may be a highly doped contact layer having a same conductivity type as the semiconductor layer 506 and/or a substrate of the semiconductor body 500 or may be a highly doped charge injection layer having a conductivity type different from the semiconductor layer 506. By way of example, the buried auxiliary layer pattern 502 may act as a mask when implanting/diffusing the dopants into the contact or charge injection layer 564. The doped region 563 may include dopants introduced by diffusion from the semiconductor layer 506 or any external dopant source and/or dopants introduced through the second surface and through the buried auxiliary layer pattern 502 by ion implantation.

Figure 5D:
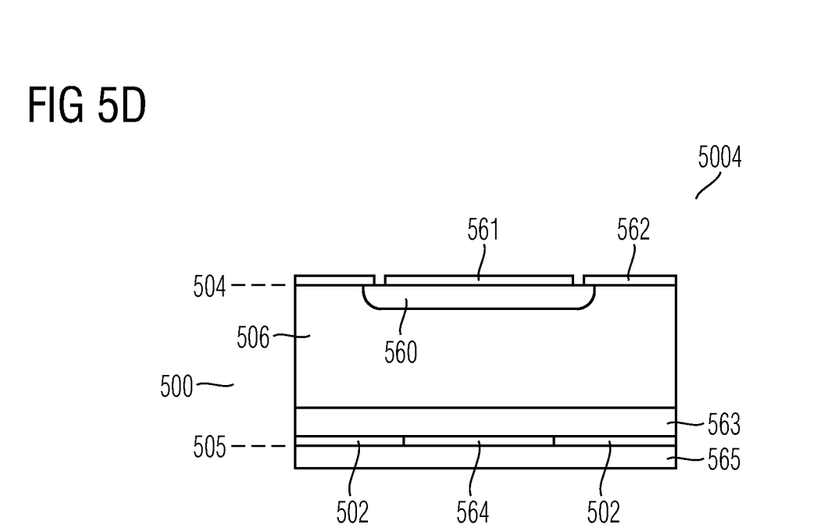

Referring to the schematic cross-sectional view 5004 of FIG. 5D, the semiconductor body 500 is removed from the second surface 505 up to the buried auxiliary layer pattern 502 acting as a termination structure for the removal process. A second load contact 565 is formed on the buried auxiliary layer pattern 502 and on the contact or charge injection layer 564.

Figure 5E:
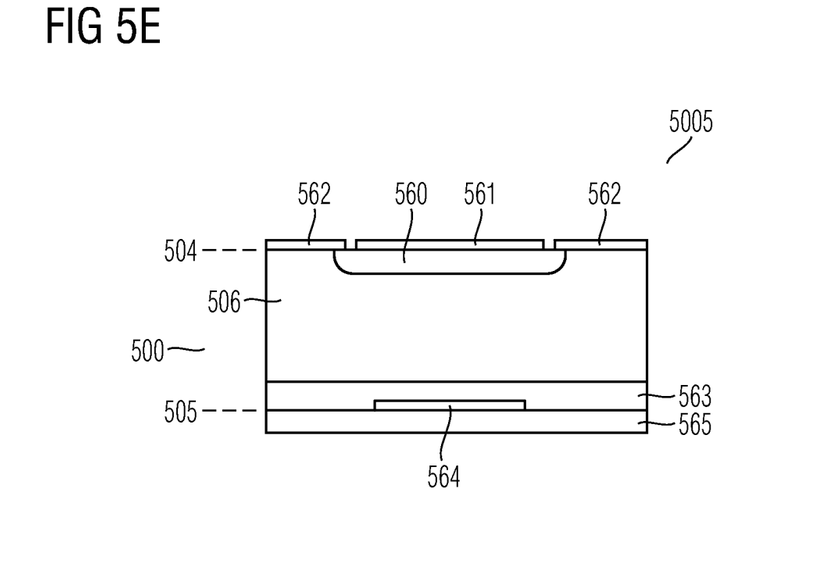

Referring to the schematic cross-sectional view 5005 of FIG. 5E, removal of the semiconductor body 500 is supplemented by removal of the buried auxiliary layer pattern 502. Before removing the buried auxiliary layer pattern 502, the buried auxiliary layer pattern 502 may act as an ion implantation mask for forming p- and n-doped regions in the semiconductor body 500 or as diffusion mask when diffusing p- or n-dopants out of the semiconductor body 500 into the semiconductor layer 506. By appropriately choosing dose and energy of ion implantation, p- and n-doped regions for achieving reverse conductivity of an reverse conducting (RC) IGBT may be formed at the second surface 505, for example.

Figure 5F:
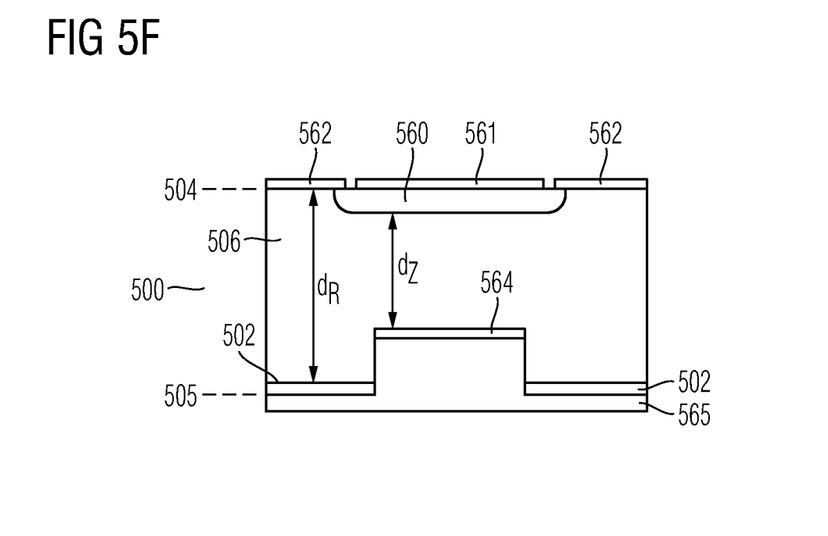

Referring to the schematic cross-sectional view 5006 of FIG. 5F, removal of the semiconductor body 500 is supplemented by a removal of the semiconductor layer 506 at openings of the buried auxiliary layer pattern 502, for example by an anisotropic etch process such as reactive ion etching. Thereby, a thickness $d_z$ of the semiconductor layer 506 below the active area structure 560, for example a drift or base zone is smaller than a thickness $d_R$ of the semiconductor layer 506 surrounding the active area structure 560, for example a part of the semiconductor layer 506 in an edge termination area. Thereby, a blocking voltage capability may be set greater in the edge termination area than in an active area, which may be beneficial with regard to avalanche robustness. Other than illustrated in FIG. 5F, the buried auxiliary layer pattern 502 may also be removed before formation of the second load contact 565.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor device, the method comprising:
    forming an auxiliary structure at a first surface of a semiconductor body;
    forming a semiconductor layer on the semiconductor body at the first surface;
    forming semiconductor device elements at the first surface; and
    removing the semiconductor body from a second surface opposite to the first surface at least up to an edge of the auxiliary structure oriented to the second surface, and wherein the semiconductor body is removed from the second surface by abrasive machining, and the abrasive machining is stopped at a vertical distance to the edge of the auxiliary structure oriented to the second surface, and wherein the semiconductor body is further removed up to the edge of the auxiliary structure oriented to the second surface by an etch process.

2. The method of claim 1, wherein forming the auxiliary structure comprises:
    implanting oxygen ions into the semiconductor body through the first surface at an ion implantation energy smaller than 100 keV.

3. The method of claim 2, wherein a dose of oxygen ion implantation is in a range of $10^{14}$ cm$^{-2}$ and $10^{17}$ cm$^{-2}$.

4. The method of claim 2, further comprising:
    after oxygen ion implantation, thermal processing of the semiconductor body, wherein a budget of the thermal processing is configured to reallocate the implanted oxygen to oxygen precipitates.

5. The method of claim 4, further comprising:
    prior to the thermal processing, irradiating the semiconductor body with particles from the first surface.

6. The method of claim 2, further comprising:
    prior to oxygen ion implantation, forming a patterned ion implantation mask on the first surface.

7. The method of claim 6, further comprising:
    prior to formation of the patterned ion implantation mask, forming alignment marks, and wherein the patterned ion implantation mask is aligned with the alignment marks.

8. The method of claim 1, wherein forming the auxiliary structure comprises:
    forming an auxiliary layer pattern on the first surface of the semiconductor layer.

9. The method of claim 8, wherein the auxiliary structure includes one of or any combination of silicon oxide, silicon nitride, oxynitride, aluminum oxide, carbon.

10. The method of claim 8, wherein a thickness of the auxiliary layer pattern is in a range of 5 nm and 2 μm.

11. The method of claim 8, wherein the auxiliary layer pattern comprises an array of openings, and a center-to-center distance p of the array of openings is smaller than 2 μm.

12. The method of claim 11, wherein a thickness of the semiconductor layer is set at least two times greater than the center-to-center distance p.

13. The method of claim 8, wherein a ratio of a surface area of the semiconductor body covered by material of the auxiliary layer pattern and a surface area below openings in the auxiliary layer pattern is in a range of 0.2 to 2 and a maximum lateral dimension of any one of the openings is smaller than 2 μm.

14. The method of claim 1, further comprising:
    after forming semiconductor device elements at the first surface and prior to removing the semiconductor body from the second surface, mounting the semiconductor body to a carrier via the first surface.

15. The method of claim 1, further comprising:
    forming recesses in the semiconductor body caused by the etch process affecting the semiconductor body through openings in the auxiliary layer pattern.

16. The method of claim 1, further comprising:
    implanting dopant ions into the semiconductor body through the second surface, wherein the auxiliary structure forms an ion implantation mask for implanting the dopant ions.

17. The method of claim 16, further comprising:
    forming a contact layer on the semiconductor body at the second surface.

18. The method of claim 1, further comprising:
    removing the auxiliary structure from the second surface.

19. The method of claim 1, wherein forming semiconductor device elements at the first surface includes at least one of the processes of forming a doped drain region, forming a doped source region, forming a doped body region, forming a doped anode region, forming a doped cathode region, forming a planar gate structure including a gate dielectric and a gate electrode, and forming a gate structure including a gate dielectric and a gate electrode in a trench.

20. A method of forming a semiconductor device, the method comprising:
- forming an auxiliary structure at a first surface of a semiconductor body;
- forming a semiconductor layer on the semiconductor body at the first surface;
- forming semiconductor device elements at the first surface;
- removing the semiconductor body from a second surface opposite to the first surface at least up to an edge of the auxiliary structure oriented to the second surface; and
- wherein the auxiliary structure includes one of or any combination of silicon oxide, silicon nitride, oxynitride, aluminum oxide, carbon, and a ratio of a surface area of the semiconductor body covered by material of the auxiliary layer pattern and a surface area below openings in the auxiliary layer pattern is in a range of 0.2 to 2 and a maximum lateral dimension of any one of the openings is smaller than 2 µm.

* * * * *